US006930568B2

(12) United States Patent
Snyder et al.

(10) Patent No.: US 6,930,568 B2
(45) Date of Patent: Aug. 16, 2005

(54) RF DELAY LINES WITH VARIABLE COMPOSITION FLUIDIC DIELECTRIC

(75) Inventors: Steven Robert Snyder, Palm Bay, FL (US); Stephen B. Brown, Palm Bay, FL (US); Raymond C. Rumpf, Melbourne, FL (US); Brett Pigon, Palm Bay, FL (US); James J. Rawnick, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 155 days.

(21) Appl. No.: 10/300,456

(22) Filed: Nov. 19, 2002

(65) Prior Publication Data

US 2004/0095208 A1 May 20, 2004

(51) Int. Cl.[7] .................................................. H03H 7/30
(52) U.S. Cl. .......................... 333/156; 333/161; 333/32
(58) Field of Search ................................ 333/156, 161, 333/205, 32

(56) References Cited

U.S. PATENT DOCUMENTS

| | | | | | |
|---|---|---|---|---|---|
| 3,432,777 | A | * | 3/1969 | Taylor, Jr. et al. | 333/159 |
| 3,701,058 | A | * | 10/1972 | Smith | 333/159 |
| 5,162,972 | A | * | 11/1992 | Gripshover et al. | 361/277 |
| 5,459,442 | A | * | 10/1995 | James | 333/156 |
| 6,443,179 | B1 | * | 9/2002 | Benavides et al. | 137/454.2 |
| 6,515,235 | B2 | * | 2/2003 | Moller | 174/256 |

OTHER PUBLICATIONS

U.S. Appl. No. 10/369,436, filed Feb. 18, 2003, Rawnick et al.

U.S. Appl. No. 10/387,208, filed Mar. 11, 2003, Rawnick et al.

U.S. Appl. No. 10/330,755, filed Dec. 27, 2002, Rawnick et al.

U.S. Appl. No. 10/330,754, filed Dec. 27, 2002, Rawnick et al.

U.S. Appl. No. 10/361,548, filed Feb. 10, 2003, Rawnick et al.

U.S. Appl. No. 10/387,209, filed Mar. 11, 2003, Rawnick et al.

U.S. Appl. No. 10/387,194, filed Mar. 11, 2003, Brown et al.

U.S. Appl. No. 10/438,435, filed May 15, 2003, Brown et al.

U.S. Appl. No. 10/414,696, filed Mar. 16, 2003, Brown et al.

U.S. Appl. No. 10/637,027, filed Aug. 7, 2003, Brown et al.

U.S. Appl. No. 10/414,650, filed Apr. 16, 2003, Brown et al.

U.S. Appl. No. 10/635,629, filed Aug. 6, 2003, Brown et al.

U.S. Appl. No. 10/459,067, filed Jun. 11, 2003, Brown et al.

U.S. Appl. No. 10/438,436, filed May 15, 2003, Rawnick et al.

(Continued)

*Primary Examiner*—Stephen E. Jones
(74) *Attorney, Agent, or Firm*—Sacco & Associates, PA

(57) ABSTRACT

Method and apparatus for producing a variable delay for an RF signal. The method can include the step of propagating the RF signal along an RF transmission line, coupling a fluidic dielectric to the RF transmission line, and dynamically changing a composition of the fluidic dielectric to selectively vary its permittivity in response to a time delay control signal. The method can also include the step of dynamically changing a composition of the fluidic dielectric to vary its permeability. The permittivity and the permeability can be varied concurrently in response to the time delay control signal. In a preferred embodiment the method can include selectively varying the permeability concurrently with the permittivity to maintain a characteristic impedance of the transmission line approximately constant.

32 Claims, 3 Drawing Sheets

OTHER PUBLICATIONS

U.S. Appl. No. 10/626,090, filed Jul. 24, 2003, Brown et al.
U.S. Appl. No. 10/635,582, filed Aug. 6, 2003, Rawnick et al.
U.S. Appl. No. 10/632,632, filed Aug. 1, 2003, Rawnick et al.
U.S. Appl. No. 10/614,149, filed Jul. 7, 2003, Brown et al.
U.S. Appl. No. 10/634,219, filed Aug. 5, 2003, Rawnick et al.
U.S. Appl. No. 10/458,859, filed Jun. 11, 2003, Rawnick et al.
U.S. Appl. No. 10/624,378, filed Jul. 22, 2003, Brown et al.
U.S. Appl. No. 10/438,433, filed May 15, 2003, Rawnick et al.
U.S. Appl. No. 10/460,947, filed Jun. 13, 2003, Rawnick et al.
U.S. Appl. No. 10/421,352, filed Apr. 23, 2003, Rawnick et al.
U.S. Appl. No. 10/409,261, filed Mar. 8, 2003, Pike.
U.S. Appl. No. 10/441,743, filed May 19, 2003, Pike.
U.S. Appl. No. 10/628,846, filed Jul. 28, 2003, Pike et al.
U.S. Appl. No. 10/300,455, filed Nov. 19, 2002, Brown et al.

* cited by examiner

RF DELAY LINES WITH VARIABLE COMPOSITION FLUIDIC DIELECTRIC

STATEMENT REGARDING FEDERALLY SPONSORED RESEARCH OR DEVELOPMENT

The United States Government has rights in this invention pursuant to Contract No. NRO000-02-C-0388 between the National Reconnaissance Office and Harris Corporation.

BACKGROUND OF THE INVENTION

1. Statement of the Technical Field

The present invention relates to the field of delay lines, and more particularly to variable RF delay lines.

2. Description of the Related Art

Delay lines are used for a wide variety of signal processing applications. For example, broadband time delay circuits are used in beam-forming applications in phased array antennas. Typical fixed geometry, true time delay circuits used in phased array antennas are comprised of switched lengths of transmission line. Despite the importance of broadband delay lines in such systems, the conventional approach to designing and implementing these components suffer from a number of drawbacks. For example, conventional delay line devices often require a relatively large number of RF switches that can result in signal losses. Also, conventional time delay circuits can be limited with regard to the delay resolution that can be achieved.

RF delay lines are often formed as ordinary transmission lines coupled to a dielectric. Depending upon the structure of the transmission line, the dielectric can be arranged in different ways. For example, microstrip, stripline circuits commonly are formed on a dielectric substrate. Two important characteristics of dielectric materials are permittivity (sometimes called the relative permittivity or $\in_r$) and permeability (sometimes referred to as relative permeability or $\mu_r$). The relative permittivity and permeability determine the propagation velocity of a signal, which is approximately inversely proportional to $\sqrt{\mu\in}$. The propagation velocity directly effect the electrical length of a transmission line and therefore the amount of delay introduced to signals that traverse the line.

Further, ignoring loss, the characteristic impedance of a transmission line, such as stripline or microstrip, is equal to $\sqrt{L_l/C_l}$ where $L_l$ is the inductance per unit length and $C_l$ is the capacitance per unit length. The values of $L_l$ and $C_l$ are generally determined by the permittivity and the permeability of the dielectric material(s) used to separate the transmission line structures as well as the physical geometry and spacing of the line structures.

For a given geometry, an increase in dielectric permittivity or permeability necessary for providing increased time delay will generally cause the characteristic impedance of the line to change. However, this is not a problem where only a fixed delay is needed, since the geometry of the transmission line can be readily designed and fabricated to achieve the proper characteristic impedance. When a variable time delay is needed, however, such techniques have traditionally been viewed as impractical because of the obvious difficulties in dynamically varying the permittivity and/or permeability of a dielectric board substrate material and/or dynamically varying transmission line geometries.

Other types of variable delay lines include implementations of lines that have used mechanical means to vary the electrical length. One such arrangement included a plurality of telescoping tubes to produce a variable length coaxial line. These devices were at one time fairly common in laboratories for tuning circuits, but they suffered from certain drawbacks. For example, they were subject to wear, difficult to control electronically, and not easily scaleable to microwave frequencies. Accordingly, the only practical solution for electronic implementations of variable delay lines has been to use conventional fixed length RF transmission lines with delay variability achieved using a series of electronically controlled switches.

SUMMARY OF THE INVENTION

The invention concerns a method and apparatus for producing a variable delay for an RF signal. The method can include the step of propagating the RF signal along an RF transmission line, coupling a fluidic dielectric to the RF transmission line, and dynamically changing a composition of the fluidic dielectric to selectively vary its permittivity and/or its permeability in response to a time delay control signal. The method can also include the step of dynamically changing a composition of the fluidic dielectric to vary its permeability. The permittivity and the permeability can be varied concurrently in response to the time delay control signal. In a preferred embodiment the method can include selectively varying the permeability concurrently with the permittivity to maintain a characteristic impedance of the transmission line approximately constant.

A continuously variable true time delay line apparatus in accordance with the invention includes a fluidic dielectric and a composition processor adapted for changing a composition of the fluidic dielectric to vary its permittivity. The delay line can also include an RF transmission line at least partially coupled to the fluidic dielectric substrate. A controller controls the composition processor for selectively varying the permittivity in response to a time delay control signal. The composition processor is further adapted for changing a composition of the fluidic dielectric to vary the permeability. The controller causes the composition processor to selectively vary the permittivity and the permeability in response to the time delay control signal.

The transmission line can also be coupled to a solid dielectric substrate material. In that case, the permeability of the fluidic dielectric is varied to be approximately equal to $\mu_{r,sub}(\in_r/\in_{r,sub})$ where $\mu_{r,sub}$ is the permeability of the solid dielectric substrate, $\in_r$ is the permittivity of the fluidic dielectric and $\in_{r,sub}$ is the permittivity of the solid dielectric substrate. The velocity of propagation will be lower for higher values of $\in_r$ and $\mu_r$. According to one aspect of the invention, the solid dielectric substrate can be formed from a ceramic material. For example, the solid dielectric substrate can be formed from a low temperature co-fired ceramic.

The composition processor can be comprised of a plurality of fluid reservoirs containing fluidic dielectric components. These can include a first fluid reservoir for a low permittivity, low permeability component of the fluidic dielectric, a second fluid reservoir for a high permittivity, low permeability component of the fluidic dielectric, and a third fluid reservoir for a high permittivity, high permeability component of the fluidic dielectric. The delay line system can also include one or more proportional valves, mixing pumps, and conduits for selectively mixing and communicating the components of the fluidic dielectric from the fluid reservoirs to a cavity coupled to the RF transmission line. Further, the composition processor can advantageously separate the component parts of the fluidic dielectric so that they can be reused in subsequent fluidic dielectric mixtures.

The fluidic dielectric can be comprised of an industrial solvent that can have a suspension of magnetic particles contained therein. For example, the fluid dielectric can contain between about 50% to 90% magnetic particles by weight. The paramagnetic particles can be formed of a material selected from the group consisting of a ferrite, metallic salts, and organo-metallic particles.

DETAILED DESCRIPTION OF THE INVENTION

Figure 1:
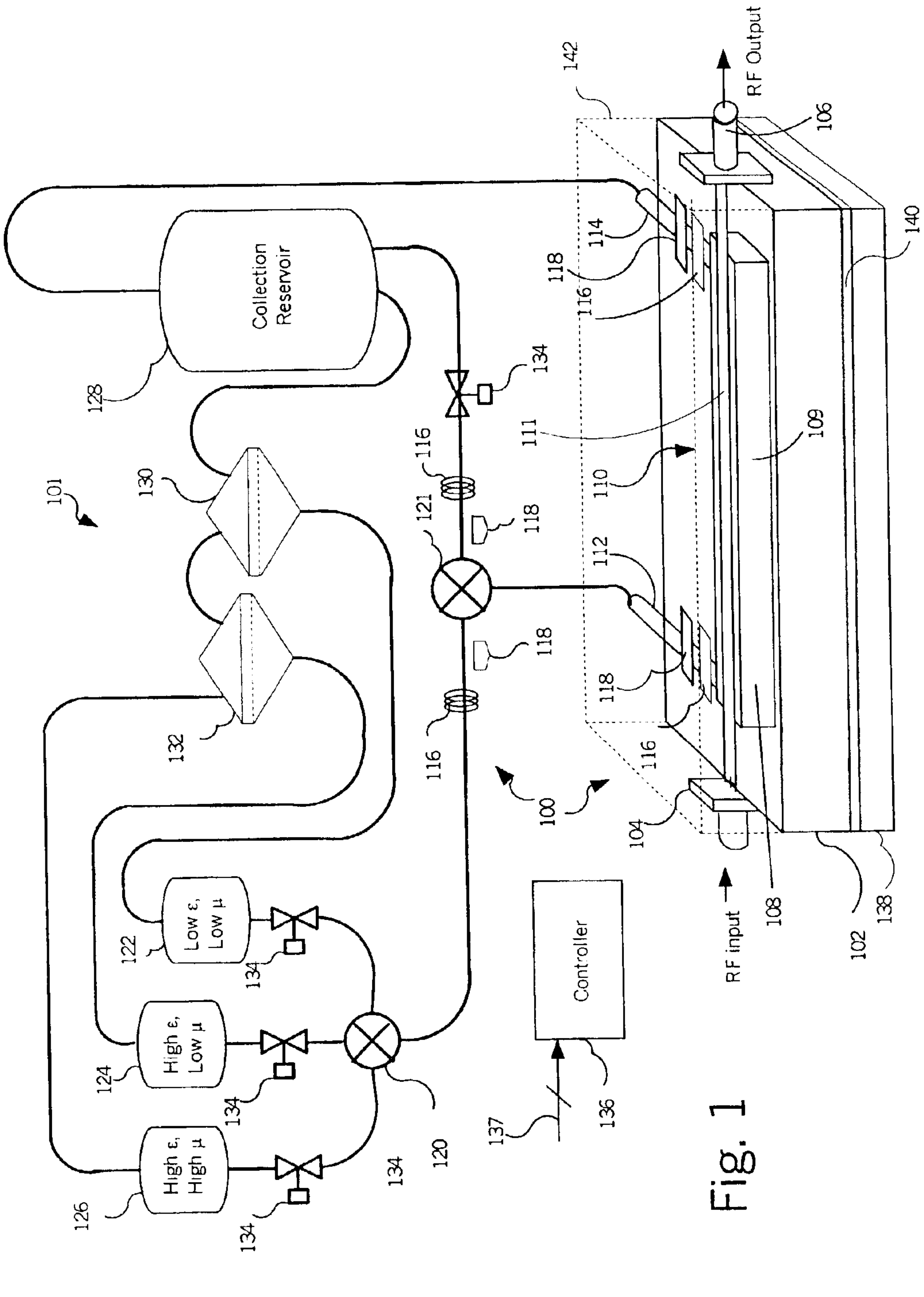
FIG. 1 is a block diagram useful for understanding the variable delay line of the invention.

FIG. 1 is a conceptual diagram that is useful for understanding the continuously variable time delay line of the present invention. The delay line apparatus 100 includes an RF transmission line 110 at least partially coupled to a fluidic dielectric 108. In FIG. 1, the RF transmission line is comprised of a conductor 111 suspended over a ground plane 140, but the invention is not so limited. The fluidic dielectric 108 is constrained within a cavity region 109 that is generally positioned relative to the RF transmission line 110 so as to be electrically and magnetically coupled thereto. A composition processor 101 is provided for changing a composition of the fluidic dielectric 108 to vary its permittivity. A controller 136 controls the composition processor for selectively varying the permittivity of the fluidic dielectric 108 in response to a time delay control signal 137. The composition processor 101 is also adapted for changing a composition of the fluidic dielectric to vary its permeability. According to a preferred embodiment, the controller 136 causes the composition processor 101 to selectively vary the permittivity and the permeability of the fluidic dielectric in response to the time delay control signal so as to maintain a constant characteristic impedance for the transmission line 110. By selectively varying the permittivity of the fluidic dielectric, the controller 136 can control propagation velocity of an RF signal along the transmission line 110. This characteristic can be used to selectively delay RF signals by a predetermined amount of time in accordance with an input control signal 137. According to a preferred embodiment, the composition processor is also adapted for separating the component parts of the fluidic dielectric so that they can be subsequently re-used.

Composition of Fluidic Dielectric

The fluidic dielectric can be comprised of several component parts that can be mixed together to produce a desired permeability and permittivity required for a particular time delay and transmission line characteristic impedance. In this regard, it will be readily appreciated that fluid miscibility and particle suspension are key considerations to ensure proper mixing. Another key consideration is the relative ease by which the component parts can be subsequently separated from one another. The ability to separate the component parts is important when the time delay requirements change. Specifically, this feature ensures that the component parts can be subsequently re-mixed in a different proportion to form a new fluidic dielectric.

The resultant mixture comprising the fluidic dielectric also preferably has a relatively low loss tangent to minimize the amount of RF energy lost in the delay line device. However, devices with higher insertion loss may be acceptable in some instances so this may not be a critical factor. Many applications also require delay lines with a broadband response. Accordingly, it may be desirable in many instances to select component mixtures that produce a fluidic dielectric that has a relatively constant response over a broad range of frequencies.

Aside from the foregoing constraints, there are relatively few limits on the range of component parts that can be used to form the fluidic dielectric. Accordingly, those skilled in the art will recognize that the examples of component parts, mixing methods and separation methods as shall be disclosed herein are merely by way of example and are not intended to limit in any way the scope of the invention. Also, the component materials are described herein as being mixed in order to produce the fluidic dielectric. However, it should be noted that the invention is not so limited. Instead, it should be recognized that the composition of the fluidic dielectric could be modified in other ways. For example, the component parts could be selected to chemically react with one another in such a way as to produce the fluidic dielectric with the desired values of permittivity and or permeability. All such techniques will be understood to be included to the extent that it is stated that the composition of the fluidic dielectric is changed.

A nominal value of permittivity ($\in_r$) for fluids is approximately 2.0. However, the component parts for the fluidic dielectric can include fluids with extreme values of permittivity. Consequently, a mixture of such component parts can be used to produce a wide range of intermediate permittivity values. For example, component fluids could be selected with permittivity values of approximately 2.0 and about 58 to produce a fluidic dielectric with a permittivity anywhere within that range after mixing. Dielectric particle suspensions can also be used to increase permittivity.

According to a preferred embodiment, the component parts of the fluidic dielectric can be selected to include a low permittivity, low permeability component and a high permittivity, high permeability component. These two components can be mixed as needed for increasing permittivity while maintaining a relatively constant ratio of permittivity to permeability. A third component part of the fluidic dielectric can include a high permittivity, low permeability component for allowing adjustment of the permittivity of the fluidic dielectric independent of the permeability.

High levels of magnetic permeability are commonly observed in magnetic metals such as Fe and Co. For example, solid alloys of these materials can exhibit levels of $\mu_r$ in excess of one thousand. By comparison, the permeability of fluids is nominally about 1.0 and they generally do not exhibit high levels of permeability. However, high permeability can be achieved in a fluid by introducing metal particles/elements to the fluid. For example typical magnetic fluids comprise suspensions of ferro-magnetic particles in a conventional industrial solvent such as water, toluene, mineral oil, silicone, and so on. Other types of magnetic particles include metallic salts, organo-metallic compounds, and other derivatives, although Fe and Co particles are most common. The size of the magnetic particles found in such systems is known to vary to some extent. However, particles sizes in the range of 1 nm to 20 $\mu$m are common. The composition of particles can be varied as necessary to achieve the required range of permeability in the final mixed fluidic dielectric after mixing. However, magnetic fluid compositions are typically between about 50% to 90% particles by weight. Increasing the number of particles will generally increase the permeability.

An example of a set of component parts that could be used to produce a fluidic dielectric as described herein would include oil (low permittivity, low permeability), a solvent (high permittivity, low permeability) and a magnetic fluid, such as combination of an oil and a ferrite (low permittivity and high permeability). A hydrocarbon dielectric oil such as Vacuum Pump Oil MSDS-12602 could be used to realize a low permittivity, low permeability fluid, low electrical loss fluid. A low permittivity, high permeability fluid may be realized by mixing same hydrocarbon fluid with magnetic particles such as magnetite manufactured by FerroTec Corporation of Nashua, N.H., or iron-nickel metal powders manufactured by Lord Corporation of Cary, N.C. for use in ferrofluids and magnetoresrictive (MR) fluids. Additional ingredients such as surfactants may be included to promote uniform dispersion of the particle. Fluids containing electrically conductive magnetic particles require a mix ratio low enough to ensure that no electrical path can be created in the mixture.

Solvents such as formamide inherently posses a relatively high permittivty and are therefore suitable for use as the high permittivity component. Alternatively, the high permittivity component of the fluidic dielectric can be produced by adding high permittivity powders such as barium titanate manufactured by Ferro Corporation of Cleveland, Ohio. For broadband applications, the fluids would not have significant resonances over the frequency band of interest.

Processing of Fluidic Dielectric for Mixing/Unmixing of Components

The composition processor 101 can be comprised of a plurality of fluid reservoirs containing component parts of fluidic dielectric 108. These can include a first fluid reservoir 122 for a low permittivity, low permeability component of the fluidic dielectric, a second fluid reservoir 124 for a high permittivity, low permeability component of the fluidic dielectric, and a third fluid reservoir 126 for a high permittivity, high permeability component of the fluidic dielectric. Those skilled in the art will appreciate that other combinations of component parts may also be suitable and the invention is not intended to be limited to the specific combination of component parts described herein.

Figure 2:
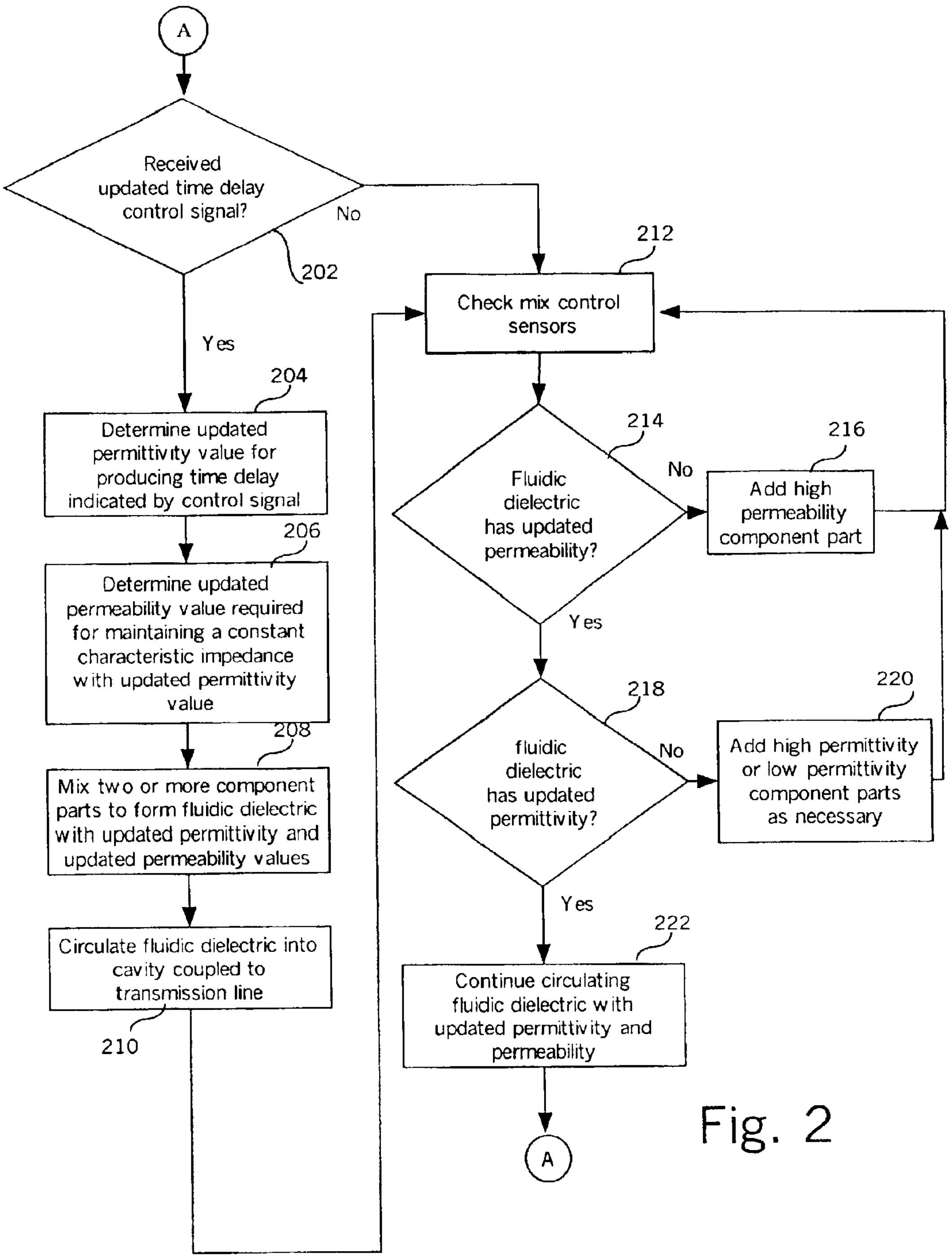
FIG. 2 is a flow chart that is useful for understanding the process of the invention.

A cooperating set of proportional valves 134, mixing pumps 120, 121, and connecting conduits 138 can be provided as shown in FIG. 1 for selectively mixing and communicating the components of the fluidic dielectric 108 from the fluid reservoirs 122, 124, 126 to cavity 109. The composition processor also serves to separate out the component parts of fluidic dielectric 108 so that they can be subsequently re-used to form the fluidic dielectric with different permittivity and/or permeability values. All of the various operating functions of the composition processor can be controlled by controller 136. The operation of the composition processor shall now be described in greater detail with reference to FIG. 1 and the flowchart shown in FIG. 2.

The process can begin in step 202 of FIG. 1, with controller 136 checking to see if an updated time delay control signal has been received on a control signal input line 137. If so, then the controller 137 continues on to step 204 to determine an updated permittivity value for producing the time delay indicated by the control signal. The updated permittivity value necessary for achieving the indicated time delay can be determined using a look-up table. Alternatively, the updated permittivity value can be calculated directly based on the length of the transmission line using equations well known to those skilled in the art.

In step 206, the controller can determine an updated permeability value required for maintaining a constant characteristic impedance of transmission line 110. In step 208, the controller 136 causes the composition processor 101 to begin mixing two or more component parts in a proportion to form fluidic dielectric that has the updated permittivity and permeability values determined earlier. This mixing process can be accomplished by any suitable means. For example, in FIG. 1 a set of proportional valves 134 and mixing pump 120 are used to mix component parts from reservoirs 122, 124, 126 appropriate to achieve the desired updated permeability and permittivity.

In step 210, the controller causes the newly mixed fluidic dielectric 108 to be circulated into the cavity 109 through a second mixing pump 121. In step 212, the controller checks one or more sensors 116, 118 to determine if the fluidic dielectric being circulated through the cavity 109 has the proper values of permeability and permittivity. Sensors 116 are preferably inductive type sensors capable of measuring permeability. Sensors 118 are preferably capacitive type sensors capable of measuring permittivity. The sensors can be located as shown, at the input to mixing pump 121. Sensors 116, 118 are also preferably positioned within solid dielectric substrate 102 to measure the permeability and permittivity of the fluidic dielectric passing through input conduit 112 and output conduit 114. Note that it is desirable to have a second set of sensors 116, 118 at or near the cavity 109 so that the controller can determine when the fluidic dielectric with updated permittivity and permeability values has completely replaced any previously used fluidic dielectric that may have been present in the cavity 109.

In step 214, the controller 136 compares the measured permeability to the desired updated permeability value determined in step 206. If the fluidic dielectric does not have the proper updated permeability value, the controller 136 can cause additional amounts of high permeability component part to be added to the mix from reservoir 126.

If the fluidic dielectric is determined to have the proper level of permeability in step 214, then the process continues on to step 218 where the measured permittivity value from step 212 is compared to the desired updated permittivity value from step 204. If the updated permittivity value has not been achieved, then high or low permittivity component parts are added as necessary in step 210. If both the permittivity and permeability passing into and out of the cavity 109 are the proper value, the system can stop circulating the fluidic dielectric and the system returns to step 202 to wait for the next updated time delay control signal.

Significantly, when updated fluidic dielectric is required, any existing fluidic dielectric must be circulated out of the cavity 109. Any existing fluidic dielectric not having the proper permeability and/or permittivity can be deposited in a collection reservoir 128. The fluidic dielectric deposited in the collection reservoir can thereafter be re-used directly as a fourth fluid by mixing with the first, second, and third fluids or separated out into its component parts in separator units 130, 132 so that it may be re-used at a later time to produce additional fluidic dielectric. The aforementioned approach includes a method for sensing the properties of the collected fluid mixture to allow the fluid processor to appropriately mix the desired composition, and thereby, allowing a reduced volume of separation processing to be required.

For example the component parts can be selected to include a first fluid made of a high permittivity solvent completely miscible with a second fluid made of a low permittivity oil that has a significantly different boiling point. A third fluid component can be comprised a ferrite particle suspension in a low permittivity oil identical to the first fluid such that the first and second fluids do not form azeotropes. Given the foregoing, the following process may be used to separate the component parts.

A first stage separation process in separator unit 130 would utilize distillation to selectively remove the first fluid from the mixture by the controlled application of heat thereby evaporating the first fluid, transporting the gas phase to a physically separate condensing surface whose temperature is maintained below the boiling point of the first fluid, and collecting the liquid condensate for transfer to the first fluid reservoir 122. A second stage process in separator unit 132 would introduce the mixture, free of the first fluid, into a chamber that includes an electromagnet that can be selectively energized to attract and hold the paramagnetic particles while allowing the pure second fluid to pass which is then diverted to the second fluid reservoir 124. Upon de-energizing the electromagnet, the third fluid would be recovered by allowing the previously trapped magnetic particles to combine with the fluid exiting the first stage which is then diverted to the third fluid reservoir 126.

Those skilled in the art will recognize that the specific process used to separate the component parts from one another will depend largely upon the properties of materials that are selected and the invention. Accordingly, the invention is not intended to be limited to the particular process outlined above.

RF Unit Structure, Materials and Fabrication

In theory, constant characteristic impedance can be obtained for a transmission line by maintaining a constant ratio of permittivity to permeability in the dielectric to which the line is coupled. Accordingly, in those instances where the transmission line is for all practical purposes coupled exclusively to the fluidic dielectric, then it is merely necessary to maintain a constant ratio of $\in_r/\mu_r$, where $\in_r$ is the permittivity of the fluidic dielectric, and $\mu_r$ is the permeability of the fluidic dielectric. A cross-sectional view of such a line is illustrated in FIG. 3*a*.

Figure 3A:
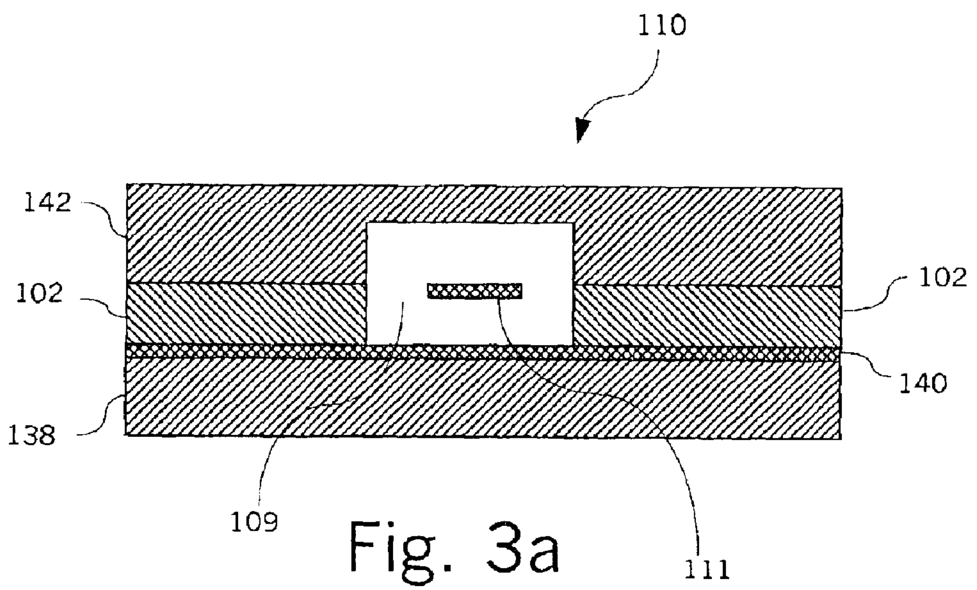
FIG. 3*a* is a cross-sectional view of the transmission line structure in FIG. 1, taken along line 3—3

FIG. 3*a* is a cross-sectional view of one embodiment of the transmission line structure in FIG. 1, taken along line 3—3, that is useful for understanding the invention. As illustrated therein, cavity 109 can be formed in substrate 102 and continued in cap substrate 142 so that the fluidic dielectric is closely coupled to transmission line 110 on all sides of conductor 111. The conductor 111 is suspended within the cavity 109 as shown. A ground plane 140 is disposed below the conductor 111 between substrate 102 and base substrate 138.

Figure 3B:
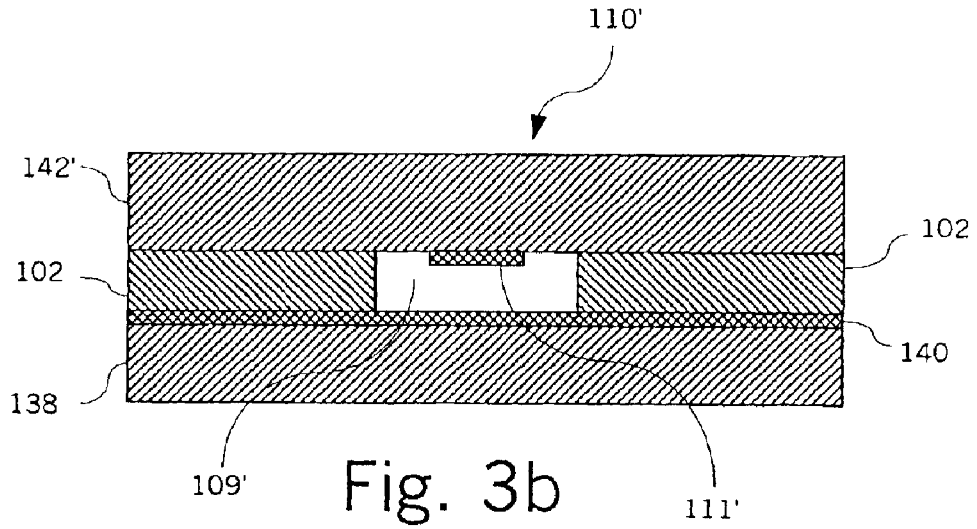
FIG. 3*b* is a cross-sectional view of an alternative embodiment of a transmission line structure of FIG. 1.

FIG. 3*b* is a cross-sectional view showing an alternative transmission line structure 110' for a delay line in which the cavity structure 109' extends on only one side of the conductor 111' and the conductor 111' is partially coupled to the solid dielectric substrate 142'. In the case where the transmission line is also partially coupled to a solid dielectric, then the permeability $\mu_r$ necessary to keep the characteristic impedance of the line constant can be expressed as follows:

$$\mu_r=\mu_{r,sub}(\in_r/\in_{r,sub})$$

where $\mu_{r,sub}$ is the permeability of the solid dielectric substrate 142, $\in_r$ is the permittivity of the fluidic dielectric 108 and $\in_{r,sub}$ is the permittivity of the solid dielectric substrate 142.

Transmission line impedance is not independent of the transmission line structure. However, it is always proportional to the square root of the ratio of the permeability to the permittivity of the media in which the conducting structures are embedded. Thus, for any transmission line, if both the permeability and permittivity are changed in the same proportion, and no other changes are made, the impedance will remain constant. The equation specified enforces the condition of a constant ratio of $\mu$ to $\in$, and thus ensures constant impedance for all transmission line structures.

At this point it should be noted that while the embodiment of the invention in FIG. 1 is shown essentially in the form of a buried microstrip construction, the invention herein is not intended to be so limited. Instead, the invention can be implemented using any type of transmission line by replacing at least a portion of a conventional solid dielectric material that is normally coupled to the transmission line with a fluidic dielectric as described herein. For example, and without limitation, the invention can be implemented in transmission line configurations including conventional waveguides, stripline, microstrip, coaxial lines, and embedded coplanar waveguides. All such structures are intended to be within the scope of the invention.

According to one aspect of the invention, the solid dielectric substrate 102, 138, 142 can be formed from a ceramic material. For example, the solid dielectric substrate can be formed from a low temperature co-fired ceramic (LTCC). Processing and fabrication of RF circuits on LTCC is well known to those skilled in the art. LTCC is particularly well suited for the present application because of its compatibility and resistance to attack from a wide range of fluids. The material also has superior properties of wetability and absorption as compared to other types of solid dielectric material. These factors, plus LTCC's proven suitability for manufacturing miniaturized RF circuits, make it a natural choice for use in the present invention.

We claim:

1. A continuously variable true time delay line, comprising:

a fluidic dielectric having a permittivity and a permeability;

a composition processor adapted for dynamically changing a composition of said fluidic dielectric to vary at least one of said permittivity and said permeability;

an RF transmission line at least partially coupled to said fluidic dielectric;

a controller for controlling said composition processor to selectively vary at least one of said permittivity and said permeability in response to a time delay control signal;

wherein said controller causes said composition processor to selectively vary said permittivity and said permeability concurrently in response to said time delay control signal.

2. The true time delay line according to claim 1 wherein a plurality of component parts are dynamically mixed together in said composition processor responsive to said time delay control signal to form said fluidic dielectric.

3. The true time delay line according to claim 1 wherein said transmission line is also coupled to a solid dielectric substrate material.

4. The true time delay line according to claim 3 wherein the effective index describing the velocity of a wave is varied by changing the composition of the fluidic dielectric.

5. The true time delay line according to claim 3 wherein said solid dielectric substrate is formed from a ceramic material.

6. The true time delay line according to claim 3 wherein said solid dielectric substrate is formed from a low temperature co-fired ceramic.

7. A continuously variable true time delay line, comprising:

a fluidic dielectric having a permittivity and a permeability;

a composition processor adapted for dynamically changing a composition of said fluidic dielectric to vary at least one of said permittivity and said permeability;

an RF transmission line at least partially coupled to said fluidic dielectric;

a controller for controlling said composition processor to selectively vary at least one of said permittivity and said permeability in response to a time delay control signal;

wherein said RF transmission line has a characteristic impedance and said controller causes said composition processor to selectively vary said permeability to maintain said characteristic impedance approximately constant when said permittivity is varied.

8. A continuously variable true time delay line, comprising:

a fluidic dielectric having permittivity and a permeability;

a composition processor adapted for dynamically changing a composition of said fluidic dielectric to vary at least one of said permittivity and said permeability;

an RF transmission line at least partially coupled to said fluidic dielectric;

a controller for controlling said composition processor to selectively vary at least one of said permittivity and said permeability in response to a time delay control signal;

wherein said RF transmission line has a characteristic impedance and said controller causes said composition processor to selectively vary said permittivity to maintain said characteristic impedance approximately constant when said permeability is varied.

9. A continuously variable true time delay line, comprising:

a fluidic dielectric having a permittivity and a permeability;

a composition processor adapted for dynamically changing a composition of said fluidic dielectric to vary at least one of said permittivity and said permeability;

an RF transmission line at least partially coupled to said fluidic dielectric;

a controller for controlling said composition processor to selectively vary at least one of said permittivity and said permeability in response to a time delay control signal;

wherein said transmission line is also coupled to a solid dielectric substrate material, and said permeability is varied to be approximately equal to $\mu_{r,sub}(\in_r/\in_{r,sub})$ where $\mu_{r,sub}$ is the permeability of the solid dielectric substrate, $\in_r$ is the permittivity of the fluidic dielectric and $\in_{r,sub}$ is the permittivity of the solid dielectric substrate.

10. A continuously variable true time delay line, comprising:

a fluidic dielectric having a permittivity and a permeability;

a composition processor adapted for dynamically changing a composition of said fluidic dielectric to vary at least one of said permittivity and said permeability;

an RF transmission line at least partially coupled to said fluidic dielectric;

a controller for controlling said composition processor to selectively vary at least one of said permittivity and said permeability in response to a time delay control signal;

wherein a plurality of component parts are dynamically mixed together in said composition processor responsive to said time delay control signal to form said fluidic dielectric, and said component parts are selected from the group consisting of a low permittivity, low permeability component, a high permittivity, low permeability component, and a high permittivity, high permeability component.

11. The true time delay line according to claim 10 wherein said fluidic dielectric is comprised of an industrial solvent.

12. The true time delay line according to claim 10 wherein said composition processor further comprises at least one proportional value, at least one mixing pump, and at least one conduit for selectively mixing and communicating a plurality of said components of said fluidic dielectric from respective fluid reservoirs to a cavity where said fluidic dielectric is coupled to said RF transmission line.

13. The time delay line according to claim 12 wherein said composition processor further comprises a component part separator adapted for separating said component parts of said fluidic dielectric for subsequent reuse.

14. A continuously variable true time delay line, comprising:

a fluidic dielectric having a permittivity and a permeability;

a composition processor adapted for dynamically changing a composition of said fluidic dielectric to vary at least one of said permittivity and said permeability;

an RF transmission line at least partially coupled to said fluidic dielectric;

a controller for controlling said composition processor to selectively vary at least one of said permittivity and said permeability in response to a time delay control signal;

wherein at least one component of said fluidic dielectric is comprised of an industrial solvent that has a suspension of magnetic particles contained therein.

15. The true time delay line according to claim 14 wherein said component contains between about 50% to 90% magnetic particles by weight.

16. The true delay line according to claim 14 wherein said magnetic particles are formed of a material selected from the group consisting of ferrite, metallic salts, and organo-metallic particles.

17. A method for producing a variable delay for an RF signal comprising the steps of:

propagating said RF signal along an RF transmission line coupled to a fluidic dielectric; and dynamically changing a composition of said fluidic dielectric to selectively vary a permittivity and a permeability of said fluidic dielectric concurrently in response to a time delay control signal.

18. The method according to claim 17 further comprising the step of selecting a component of said fluidic dielectric to include an industrial solvent.

19. The method according to claim 17 further comprising the step of selecting a component of said fluidic dielectric to include an industrial solvent that has a suspension of magnetic particles contained therein.

20. The method according to claim 19 further comprising the step of selecting a material for said magnetic particles from the group consisting of a ferrite, metallic salts, and organo-metallic particles.

21. The method according to claim 19 further comprising the step of selecting said component to include about 50% to 90% magnetic particles by weight.

22. The method according to claim 17 further comprising the step of dynamically mixing a plurality of components in response to said time delay control signal to produce said fluidic dielectric.

23. The method according to claim 22 further comprising the step of communicating said fluidic dielectric to a cavity adjacent to said conductor of said RF transmission line.

24. The method according to claim 17 further comprising the step of coupling said RF transmission line to a solid dielectric substrate material.

25. The method according to claim 24 further comprising the step of varying said permittivity so that the effective index describing the velocity of a wave is varied by changing the properties of the fluidic dielectric.

26. The method according to claim 24 further comprising the step of forming said solid dielectric substrate from a ceramic material.

27. The method according to claim 24 further comprising the step of forming said solid dielectric substrate from a low temperature co-fired ceramic.

28. A method for producing a variable delay for an RF signal comprising the steps of:

propagating said RF signal along an RF transmission line coupled to a fluidic dielectric;

dynamically changing a composition of said fluidic dielectric to selectively vary at least one of a permittivity and a permeability of said fluidic dielectric in response to a time delay control signal; and selectively varying said permeability to maintain a characteristic impedance of said transmission line approximately constant when said permittivity is varied.

29. A method for producing a variable delay for an RF signal comprising the steps of:

propagating said RF signal along an RF transmission line coupled to a fluidic dielectric;

dynamically changing a composition of said fluidic dielectric to selectively vary at least one of a permittivity and a permeability of said fluidic dielectric in response to a time delay control signal; and selectively varying said permittivity to maintain a characteristic impedance of said transmission line approximately constant when said permeability is varied.

30. A method for producing a variable delay for an RF signal comprising the steps of:

propagating said RF signal along an RF transmission line coupled to a fluidic dielectric;

dynamically changing a composition of said fluidic dielectric to selectively vary at least one of a permittivity and a permeability of said fluidic dielectric in response to a time delay control signal;

coupling said RF transmission line to a solid dielectric substrate material; and varying said permeability to be approximately equal to $\mu_{r,sub}(\epsilon_r/\epsilon_{r,sub})$ where $\mu_{r,sub}$ is the permeability of the solid dielectric substrate, $\epsilon_r$ is the permittivity of the fluidic dielectric and $\epsilon_{r,sub}$ is the permittivity of the solid dielectric substrate.

31. A method for producing a variable delay for an RF signal comprising the steps of:

propagating said RF signal along an RF transmission line coupled to a fluidic dielectric;

dynamically changing a composition of said fluidic dielectric to selectively vary at least one of a permittivity and a permeability of said fluidic dielectric in response to a time delay control signal;

dynamically mixing a plurality of components in response to said time delay control signal to produce said fluidic dielectric;

wherein said components are selected from the group consisting of a low permittivity, low permeability component, a high permittivity, low permeability component, and a high permittivity, high permeability component.

32. A method for producing a variable delay for an RF signal comprising the steps of:

propagating said RF signal along an RF transmission line coupled to a fluidic dielectric;

dynamically changing a composition of said fluidic dielectric to selectively vary at least one of a permittivity and a permeability of said fluidic dielectric in response to a time delay control signal;

dynamically mixing a plurality of components in response to said time delay control signal to produce said fluidic dielectric;

communicating said fluidic dielectric to a cavity adjacent to said conductor of said RF transmission line; and separating said components into said component parts for subsequent reuse in forming said fluidic dielectric.

* * * * *